US006410903B1

(12) United States Patent
Miyazaki

(10) Patent No.: US 6,410,903 B1
(45) Date of Patent: Jun. 25, 2002

(54) ANALOG SIGNAL PROCESSING CIRCUIT PHOTO DETECTOR AND IMAGE FORMING APPARATUS

(75) Inventor: Keizo Miyazaki, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/229,646

(22) Filed: Jan. 13, 1999

(30) Foreign Application Priority Data

Jan. 14, 1998 (JP) .......................... 10-005449
Jan. 11, 1999 (JP) .......................... 11-004574

(51) Int. Cl.$^7$ ................................ H01J 40/14
(52) U.S. Cl. ...................... 250/214 SW; 250/214 R
(58) Field of Search ............... 250/214 SW, 214 R, 250/214.1, 214 LS, 208.1; 356/221, 222; 257/236, 235, 238; 348/311, 375

(56) References Cited

U.S. PATENT DOCUMENTS

| | | | |
|---|---|---|---|
| 3,973,215 A | 8/1976 | Ahmed | 330/51 |
| 4,498,001 A | 2/1985 | Smoot | 250/214 A |
| 4,513,300 A | 4/1985 | Tatsuno et al. | 346/160 |
| 4,544,878 A | 10/1985 | Beale et al. | 323/315 |
| 4,899,348 A | 2/1990 | Kiya et al. | 372/38 |
| 5,004,901 A | 4/1991 | Yoshimoto et al. | 250/201.5 |
| 5,329,115 A | 7/1994 | Lim | 250/214 R |
| 5,481,118 A | 1/1996 | Tew | 250/551 |
| 5,521,490 A | 5/1996 | Manohar | 323/315 |
| 5,616,940 A | * 4/1997 | Kato et al. | 257/206 |
| 5,801,581 A | 9/1998 | Koizumi | 327/538 |

FOREIGN PATENT DOCUMENTS

| | | |
|---|---|---|
| EP | 0507298 | 10/1992 |
| EP | 0535808 | 4/1993 |
| EP | 0788046 | 8/1997 |
| WO | 8907792 | 8/1989 |

* cited by examiner

Primary Examiner—Que T. Le
(74) Attorney, Agent, or Firm—Fitzpatrick, Cella, Harper & Scinto

(57) ABSTRACT

An analog signal processing circuit for obtaining an output as a function of the peak value of the input has a compact circuit configuration of comprising first and second field effect transistors having the gates commonly connected and the sources to a predetermined first reference potential and a transistor having the first main electrode connected to the gates of the first and second field effect transistors, the second main electrode to the drain of the first field effect transistor and the control electrode to a second reference potential.

24 Claims, 12 Drawing Sheets

ANALOG SIGNAL PROCESSING CIRCUIT PHOTO DETECTOR AND IMAGE FORMING APPARATUS

BACKGROUND OF THE INVENTION

1. Field of the Invention

This invention relates to an analog signal processing circuit, a photo detector and an image forming apparatus and, more particularly, it relates to an analog signal processing circuit adapted to produce an output current as a function of the peak value of the input current and also to a photo detector and an image forming apparatus.

2. Related Background Art

Known analog signal processing circuits adapted to produce an output as a function of the peak value of the input current mostly rely on handling the voltage. FIG. 1 of the accompanying drawings shows a schematic circuit diagram of a peak hold circuit. Referring to FIG. 1, there are shown operational amplifiers 201, 202, diodes 203, 204, a resistor 205, a switching element for resetting operations 206, a charge holding capacitor 207, a voltage input terminal 208 and a voltage output terminal 209. Thus, peak hold circuits adapted to operate in a voltage mode normally comprise a number of components including operational amplifiers, one or more than one diodes and one or more than one capacitors to make the overall circuit configuration rather bulky. Additionally, the input current is typically applied to a peak hold circuit as shown in FIG. 1 after modifying it to show a desired voltage value by means of a current-voltage converter circuit to make the overall circuit configuration further bulky.

As pointed out above, known peak hold circuits for producing an output as a function of the peak of the input are accompanied by the problem of a large circuit configuration and hence that of a large area occupied by the circuit and a high power consumption rate.

SUMMARY OF THE INVENTION

Therefore, it is an object of the present invention to provide a peak hold circuit having a relatively small circuit configuration and adapted to operate in a current mode in order to produce an output current as a function of the peak value of the input current.

Another object of the present invention is to provide a photo detector and an image forming apparatus capable of stably outputting signals if the quantity of incident light changes.

Still another object of the present invention is to provide an analog signal processing circuit comprising first and second field effect transistors having the gates commonly connected and the sources to a predetermined first reference potential and a transistor having the first main electrode connected to the gates of the first and second field effect transistors, the second main electrode to the drain of the first field effect transistor and the control electrode to a second reference potential.

Still another object of the present invention is to provide an analog signal processing circuit comprising first and second field effect transistors having the gates commonly connected and the sources to a predetermined first reference potential, a first transistor having the first main electrode connected to the gates of the first and second field effect transistors, the second main electrode to the drain of the first field effect transistor and the control electrode to a second reference potential and a second transistor of a conductivity type different from that of the first transistor having the second main electrode connected to the connection point of the drain of the first field effect transistor and the second main electrode of the first transistor, the control electrode to a third reference potential and the first main electrode to a fourth reference potential, the difference between the second and third reference potentials being so selected as not to turning on both of the first and second transistors simultaneously.

A further object of the present invention is to provide a photo detector comprising a photoelectric converter means, a means for holding a value proportional to the peak output value of the photoelectric converter means and a means for comparing a value proportional to the output value of the photoelectric converter means and a value proportional to the held peak output value. Preferably, in a photo detector having a configuration as described above, a means for holding the peak value of the photoelectric conversion output operates to store the largest value of the incident light and automatically determines the threshold level with a ratio defined by Y/X relative to the amplitude of the output waveform of photoelectric converter means regardless of the value of the incident light, where X represents a proportional constant for the value proportional to the output value of the photoelectric converter means and Y represents a proportional constant for the value proportional to the held peak output value. Then, a horizontal synchronizing signal can be obtained constantly and stably with an enhanced level of precision regardless of fluctuations in the quantity of incident light.

A further object of the invention is to provide an image forming apparatus comprising such a photo detector.

A further object of the invention is to provide a signal processing circuit comprising a current transferring unit for outputting a plurality of electric currents proportional to the input current, a peak holding unit operating in a current mode for receiving the electric current output from the current transferring means and outputting an electric current proportional to the peak value of the input current and a current input/voltage output type current comparing unit for comparing the electric current output from the current transferring unit and the electric current output from the peak holding unit operating in a current mode.

Preferably, the current transferring means comprises a current mirror circuit.

Preferably, the signal processing circuit is adapted to convert a current signal into a voltage pulse.

DETAILED DESCRIPTION OF THE PREFERRED EMBODIMENTS

[Embodiments]

Now, the present invention will be described by referring to the accompanying drawings that illustrate preferred embodiments of the invention. Throughout the following description, the field effect transistors are MOS transistors.

(First Embodiment)

Figure 1:
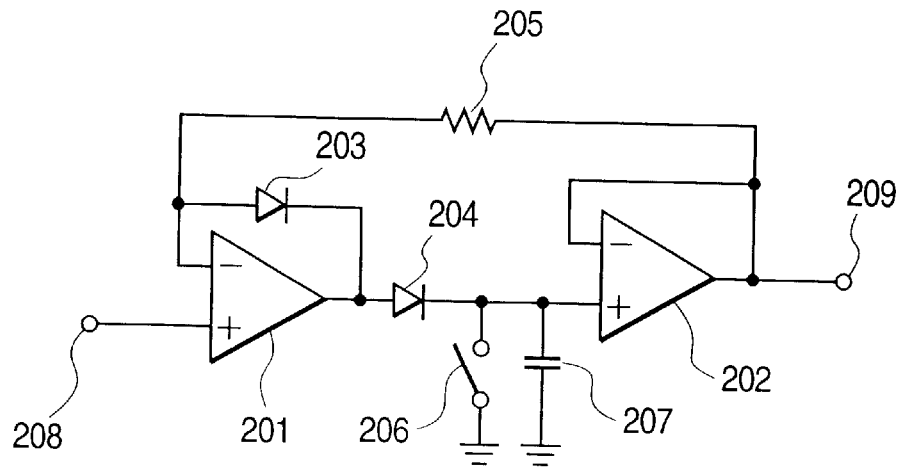
FIG. 1 is a schematic circuit diagram of a peak hold circuit adapted to operate in a voltage mode.
Figure 2:
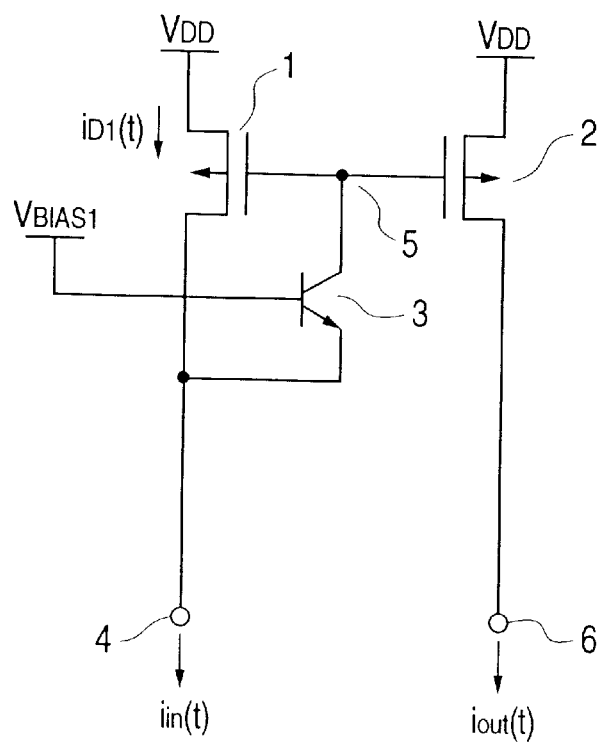
FIG. 2 is a schematic circuit diagram of an embodiment of analog signal processing circuit according to the invention.

FIG. 2 is a schematic circuit diagram of a first embodiment of analog signal processing circuit according to the invention. In FIG. 2, reference numerals 1 and 2 respectively denote first and second P-type MOS transistors having the gate terminals commonly connected and the sources connected to supply potential ($V_{DD}$), which is a predetermined reference potential common to them. Reference numeral 3 denotes an NPN transistor having the collector connected to the commonly connected gate terminals of the first and second P-type MOS transistors and the emitter connected to the drain terminal of the MOS transistor 1. Reference numeral 4 denotes the terminal commonly connecting the drain of the MOS transistor 1 and the emitter of the NPN transistor 3 and reference numeral 5 denotes the terminal commonly connecting the gates of the MOS transistors 1 and 2, while reference numeral 6 denotes the drain terminal of the MOS transistor 2.

An electric current is input through the terminal 4 and output through the terminal 6. In FIG. 2, $i_{D1}(t)$ denotes the drain current of the MOS transistor 1 at time t and $i_{in}(t)$ denotes the input current at time t, whereas $i_{out}(t)$ denotes the output current at time t, arrows indicating the positive side. Note that $i_{out}(t)$ agrees with the drain current of the MOS transistor 2.

Figure 3A:
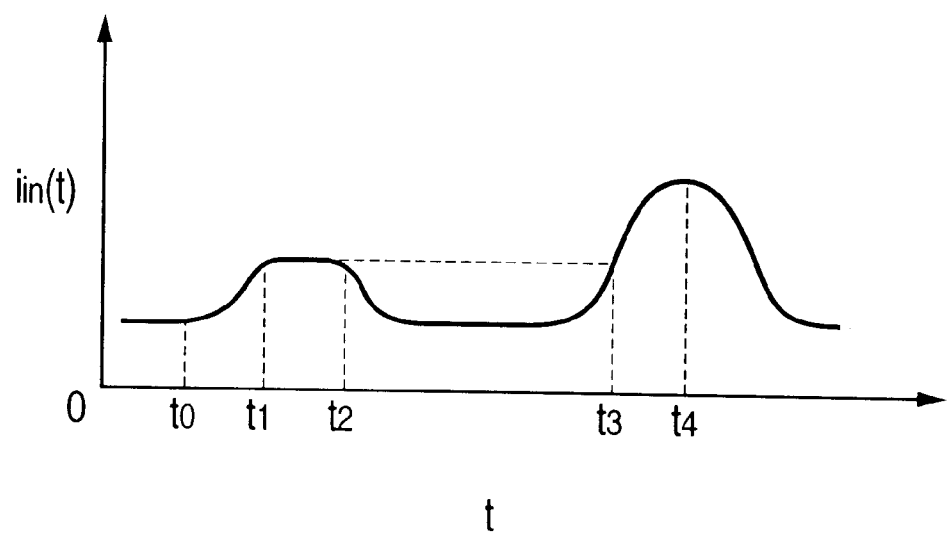
FIGS. 3A and 3B are graphs showing current waveforms that can be used in a peak hold circuit for the purpose of the invention.
Figure 3B:
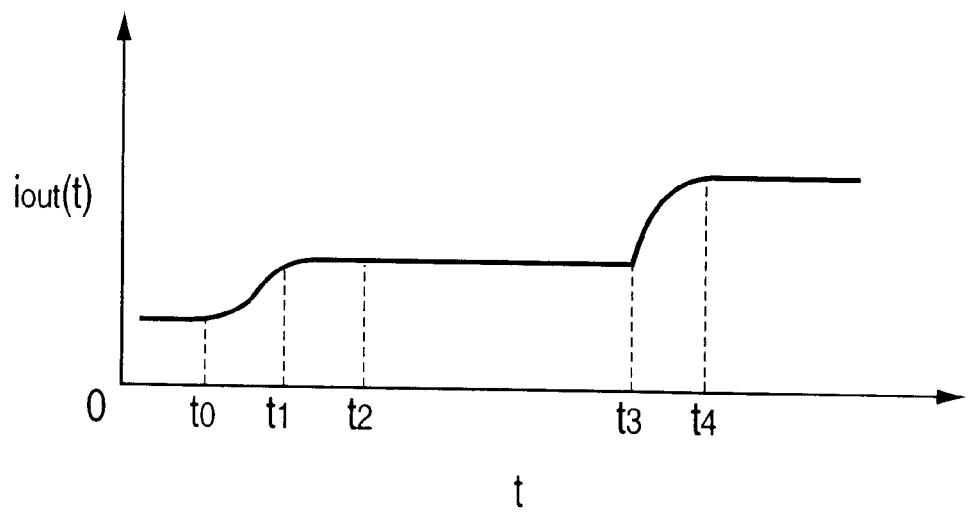

FIGS. 3A and 3B are graphs schematically showing the waveform of the input current $i_{in}(t)$ and that of the output current $i_{out}(t)$ respectively. Assume that, initially, the MOS transistor 1 is operating in a saturation region and $i_{D1}(t)$ and $i_{in}(t)$ agree with each other, whereas the NPN transistor 3 is in a cut off state. As $i_{in}(t)$ increases from $t_0$ to $t_1$, $i_{D1}(t)<i_{in}(t)$ occurs to make the voltage at terminal 4 fall and, as it falls by about 0.5 to 0.7V from $V_{BIAS1}$, the NPN transistor 3 goes into a forward active region to become turned on so that an electric current equal to $i_{in}(t)-i_{D1}(t)$ flows from the terminal 5 by way of the NPN transistor 3 to make the voltage of the terminal 5 fall until $i_{in}(t)$ agrees with $i_{D1}(t)$ or the voltage $V_{GS}(t)$ between the gate and the source of the MOS transistor 1 gets to the value expressed by equation (1) below;

$$V_{GS}(t) = V_{thp} - \sqrt{\frac{2}{\mu_p \cdot C_{OX}} \cdot \frac{L_1}{W_1} \cdot i_{in}(t)} \quad (1)$$

where $V_{thp}$ represents the threshold voltage of the P-type MOS transistors and $\mu_p$ represents the mobility of holes whereas $C_{OX}$ represents the capacitance per unit area of the gate oxide film of each of the MOS transistors and $L_1$ and $W_1$ respectively denote the gate length and gate width of the MOS transistor 1. The voltage of the terminal 5 falls as the electric charge is pulled out of the parasitic capacitance between the gates and the sources of the MOS transistors 1 and 2 connected to it through the NPN transistor 3. At this time, the circuit of FIG. 2 operates as a current mirror circuit to produce an output current proportional to the input current. Thus, since the voltage between the gate and the source of the MOS transistor 2 agrees with the voltage $V_{GS}(t)$ between the gate and the source of the MOS transistor 1, the output current $i_{out}(t)$ takes the value expressed by equation (2) below.

$$i_{out}(t) = \frac{1}{2} \cdot \mu_p \cdot C_{OX} \cdot \frac{W_2}{L_2} [V_{GS}(t) - V_{thp}]^2 \quad (2)$$

Then, equation (3) will be obtained by substituting equation (2) with equation (1) and rearranging the result;

$$i_{out}(t) = \frac{W_2/W_1}{L_2/L_1} \cdot i_{in}(t) \quad (3)$$

where L2 and W2 respectively represent the gate length and the gate width of the MOS transistor 2.

As the increase of $i_{in}(t)$ ceases in the period between time $t_1$ and time $t_2$, $i_{D1}(t)=i_{in}(t)$ occurs so that the voltage of the terminal 4 rises to bring the NPN transistor 3 into a cut off state until it gets to a value close to $V_{BIAS1}$. Since the terminal 5 has a high impedance, its electric charge does not change at time $t_1$ and the voltage between the gates and the sources of the MOS transistors 1 and 2 is held to $V_{GS}(t_1)$. Under this condition, the output current $i_{out}(t)$ is expressed by equation (4) below in view of equations (1) and (2) above.

$$i_{out}(t) = \frac{W_2/W_1}{L_2/L_1} \cdot i_{in}(t_1) \quad (4)$$

Thus, the electric current proportional to the input current $i_{in}(t_1)$ at time $t_1$ is retained.

Then, as $i_{in}(t)$ falls below $i_{in}(t_1)$ in the period between time $t_2$ and time $t_3$ to retain $V_{GS}(t_1)$, the output current $i_{out}(t)$ shows the value expressed by equation (4). Under this condition, the voltage of the terminal 4 rises to a level close to $V_{DD}$ at most to maintain $i_{D1}(t)=i_{in}(t)$ and the MOS transistor 1 operates in a non-saturation region.

Then, as the input current keeps on increasing above $i_{in}(t)$ in the period between time $t_3$ and time $t_4$, the voltage of the terminal 4 falls from $V_{BIAS1}$ by about 0.5 to 0.7V, when the NPN transistor 3 moves into a forward active region once again to become turned on so that the electric current that is equal to $i_{in}(t)-i_{D1}(t)$ flows out from the terminal 5 by way of the NPN transistor 3 to make the voltage of the terminal 5 fall until the voltage $V_{GS}(t)$ between the gate and the source of the MOS transistor 1 take the value expressed by equation (1), so that an output current $i_{out}(t)$ corresponding to the input current as expressed by equation (3).

Thus, it will be understood that, by repeating the above operation in response to fluctuations in the input current, the output current will take a value corresponding to the peak value of the input current.

(Second Embodiment)

Figure 4:
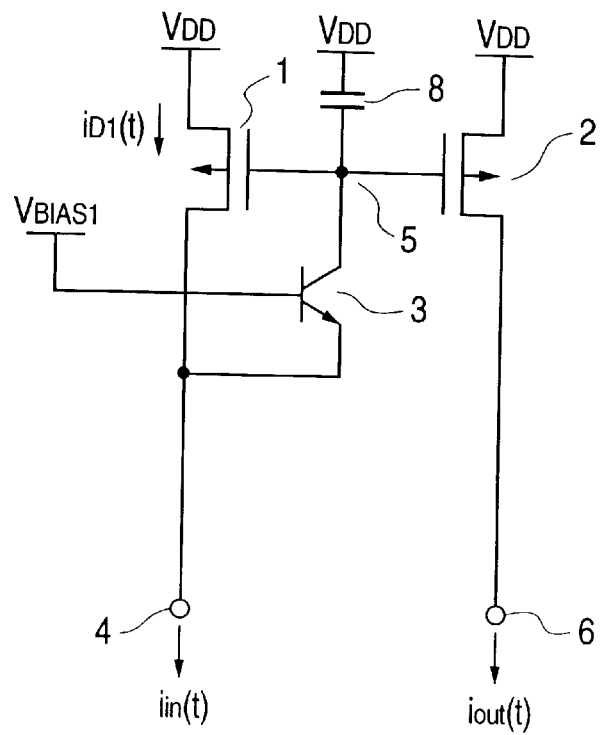
FIGS. 4, 5, 6, 7, 8, 9, 10, 11, 12, 13, 14, 15, 16, 17 and 18 are schematic circuit diagrams of different embodiments of analog signal processing circuit according to the invention.

FIG. 4 is a schematic circuit diagram of a second embodiment of analog signal processing circuit according to the invention. In FIG. 4, reference numeral 8 denotes a charge holding capacitor for holding the electric charge of the terminal 5. In FIG. 4, the components that are same as or similar to those of the embodiment of FIG. 2 are denoted respectively by the same reference numerals and would not be described here any further. While this embodiment operates in a manner same as the first embodiment, it differs from the first embodiment in that the voltage of the terminal 5 falls as the electric charge is pulled out of the parasitic capacitance between the gates and the sources of the MOS transistors 1 and 2 and also of the capacitance of the charge holding capacitor 8 through the NPN transistor 3. Thus, the quantity of the retained electric charge can be increased to accommodate the increased capacitance for holding the electric charge at the terminal 5. Therefore, if the terminal 5 shows a leak current, the voltage fluctuation error of the terminal 5 can be reduced to a level lower than that of the first embodiment after a predetermined period of time to provide an output current corresponding to the peak value of the input current on a more stable basis.

(Third Embodiment)

Figure 5:
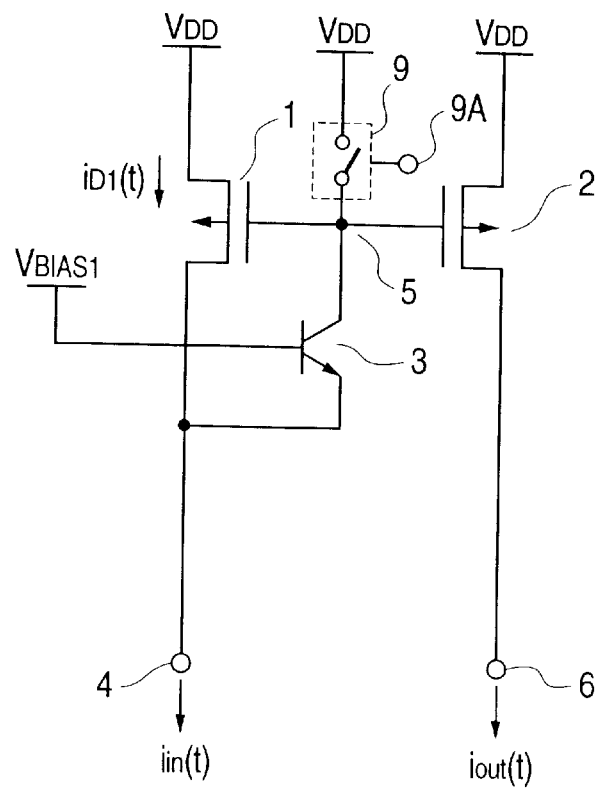

FIG. 5 is a schematic circuit diagram of a third embodiment of analog signal processing circuit according to the invention. In FIG. 5, reference numeral 9 denotes a switching element for short-circuiting the supply potential ($V_{DD}$), which is the predetermined reference potential of the terminal 5 and reference symbol 9A denotes a pulse signal input terminal for controlling the operation of closing and opening the switching element. Otherwise, the components that are same as or similar to those of the embodiment of FIG. 2 are denoted respectively by the same reference numerals in FIG. 5 and would not be described here any further. While this embodiment operates same as the first embodiment when the switching element 9 is turned off, the terminal 5 and the voltage $V_{DD}$ are short-circuited when the switching element 9 is in an ON-state so that the potential of the terminal 5 can be reset to the predetermined reference potential. Thus, this embodiment operates same as the first embodiment to carry out a new peak hold operation when the switching element 9 is turned on after a peak holding operation and turned off after raising the voltage of the terminal 5 to the predetermined reference potential.

It may be needless to say that a charge holding capacitor 8 can be added to the terminal 5 of this embodiment to obtain the effect of the second embodiment.

(Fourth Embodiment)

Figure 6:
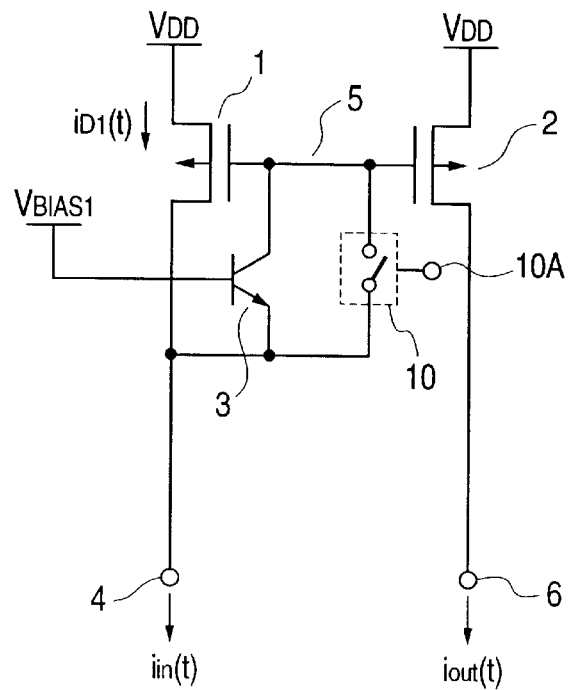

FIG. 6 is a schematic circuit diagram of a fourth embodiment of analog signal processing circuit according to the invention. In FIG. 6, reference numeral 10 denotes a switching element for short-circuiting the terminal 4 and the terminal 5 and reference symbol 10A denotes a pulse signal input terminal for controlling the operation of closing and opening the switching element. Otherwise, the components that are same as or similar to those of the embodiment of FIG. 2 are denoted respectively by the same reference numerals in FIG. 6 and would not be described here any further. While this embodiment operates same as the first embodiment when the switching element 10 is turned off, it operates as an ordinary current mirror circuit when the switching element 10 is turned on because the terminal 4 and the terminal 5 are short-circuited. Thus, the peak hold function as described above by referring to the first embodiment can be exploited more freely in this embodiment. Additionally, the potential of the terminal 5 can be raised to a reference potential level by turning on the switching element 10 after a peak hold operation if an electric current operating as reference is input so that consequently a reference output current can be obtained as a function of the input to provide the embodiment with a resetting feature. Thus, this embodiment operates same as the first embodiment to carry out a new peak hold operation when the switching element 10 is turned on thereafter.

It may be needless to say that a charge holding capacitor 8 can be added to the terminal 5 of this embodiment to obtain the effect of the second embodiment.

Still additionally, a switching element 9 for short-circuiting the terminal 5 and the supply potential ($V_{DD}$) which is a predetermined reference potential may be added to this embodiment to realize the effect of the third embodiment.

(Fifth Embodiment)

Figure 7:
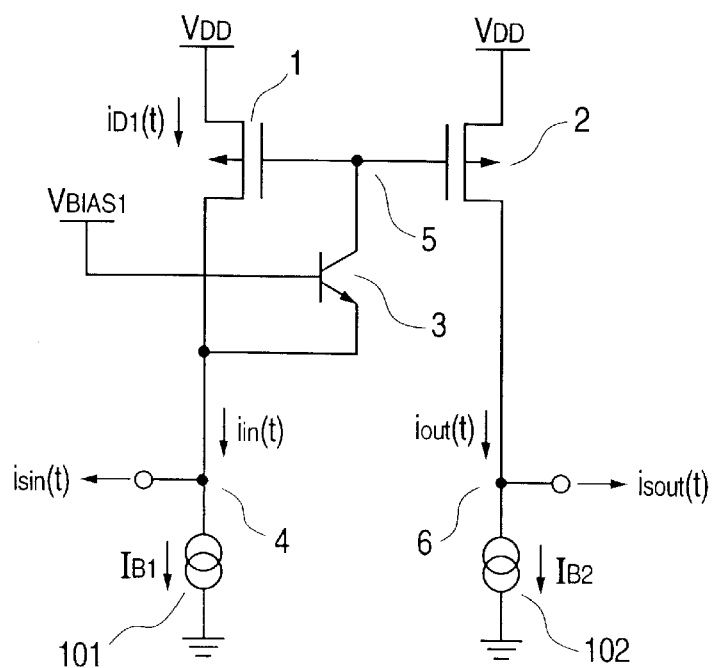

FIG. 7 is a schematic circuit diagram of a fifth embodiment of analog signal processing circuit according to the invention. In FIG. 7, reference numeral 101 denotes a constant current source for supplying the MOS transistor 1 with a predetermined constant bias current $I_{B1}$ in advance, said current source being connected to the terminal 4 and the ground potential. Reference numeral 102 denotes a constant current source connected to the ground potential with the terminal 6 for supplying the MOS transistor 2 with a constant bias current $I_{B2}$ in advance, which preferably shows a relationship with $I_{B1}$ as expressed by equation (5) to reflect the dimensional ratio of the MOS transistor 1 to the MOS transistor 2.

$$I_{B2} = \frac{W_2/W_1}{L_2/L_1} \cdot I_{B1} \qquad (5)$$

Otherwise, the components that are same as or similar to those of the embodiment of FIG. 2 are denoted respectively by the same reference numerals in FIG. 7 and would not be described here any further. While this embodiment operates same as the first embodiment, it differs from the first embodiment in that the electric current $i_{in}(t)$ input to the MOS transistor 1 is expressed as sum of bias current $I_{B1}$ and input signal current $i_{sin}(t)$ and that the electric current $i_{out}(t)$ output from the MOS transistor 2 is expressed as sum of bias current $I_{B2}$ and output signal current $i_{sout}(t)$. This embodiment can handle the signal component independently. While this embodiment is described and illustrated in terms of the constant current sources 101 and 102 added to the first embodiment, it will be appreciated that such current sources may be added to any of the second through fourth embodiments to realize a substantially same effect.

(Sixth Embodiment)

Figure 8:
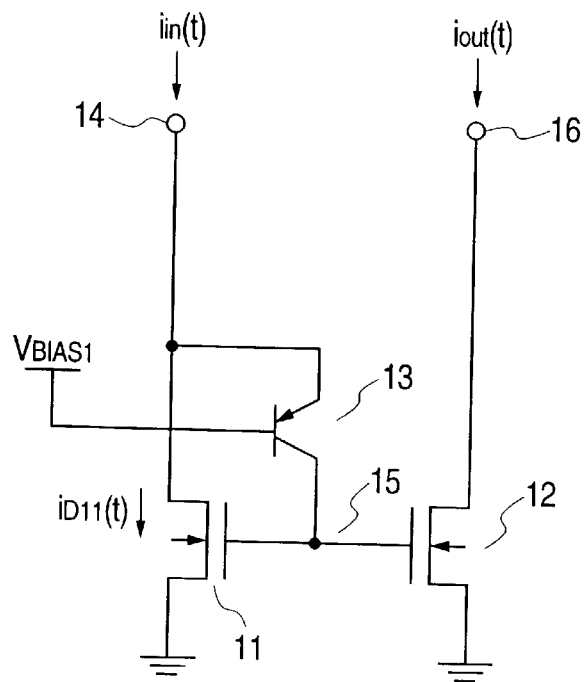

FIG. 8 is a schematic circuit diagram of a sixth embodiment of analog signal processing circuit according to the invention. This embodiment comprises MOS transistors of the conductivity type opposite to that of the MOS transistors of the first embodiment. In FIG. 8, reference numerals 11 and 12 respectively denote first and second N-type MOS transistors having the gate terminals commonly connected and the sources connected to the ground potential, which is a predetermined reference potential common to them. Reference numeral 13 denotes a PNP transistor having the collector connected to the commonly connected gate terminals of the N-type MOS transistors 11 and 12 and the emitter connected to the drain terminal of the MOS transistor 11, the base being connected to another reference potential ($V_{BIAS1}$), which is higher than a ground potential. Reference numeral 14 denotes the terminal connecting the drain of the MOS transistor 11 and the emitter of the PNP transistor 13 and reference numeral 15 denotes the terminal commonly connecting the gates of the MOS transistors 11 and 12, while reference numeral 16 denotes the drain terminal of the MOS transistor 12. An electric current is input through the terminal 14 and output through the terminal 16. In FIG. 8, $i_{D11}(t)$ denotes the drain current of the MOS transistor 11 at time t and $i_{in}(t)$ denotes the input current at time t, whereas $i_{out}(t)$ denotes the output current at time t, arrows indicating the positive side. Note that $i_{out}(t)$ agrees with the drain current of the MOS transistor 12.

Now, the operation of the embodiment of analog signal processing circuit will be described by referring to FIGS. 3A and 3B. Assume that, initially, the MOS transistor 11 is operating in a saturation region and $i_{D11}(t)$ and $i_{in}(t)$ agree with each other, whereas the PNP transistor 13 is in a cut off state. As $i_{in}(t)$ increases from $t_0$ to $t_1$, $i_{D11}(t) < i_{in}(t)$ occurs to make the voltage at terminal 14 rise and, as it rises by about 0.5 to 0.7V from $V_{BIAS1}$, the PNP transistor 13 goes into a forward active region to become turned on so that an electric current equal to $i_{in}(t) - i_{D11}(t)$ flows to the terminal 15 by way of the PNP transistor 13 to make the voltage of the terminal 15 rises until $i_{in}(t)$ agrees with $i_{D11}(t)$ or the voltage $V_{GS}(t)$ between the gate and the source of the MOS transistor 11 gets to the value expressed by equation (6) below;

$$V_{GS}(t) = V_{thn} + \sqrt{\frac{2}{\mu_n \cdot C_{OX}} \cdot \frac{L_{11}}{W_{11}} \cdot i_{in}(t)} \quad (6)$$

where $V_{thn}$ represents the threshold voltage of the N-type MOS transistors and $\mu_n$ represents the mobility of electrons whereas $C_{OX}$ represents the capacitance per unit area of the gate oxide film of each of the MOS transistors and $L_{11}$ and $W_{11}$ respectively denote the gate length and gate width of the MOS transistor 11. The voltage of the terminal 15 rises as the electric charge is supplied to the parasitic capacitance between the gates and the sources of the MOS transistors 11 and 12 connected to it through the PNP transistor 13. At this time, the circuit of FIG. 8 operates as a current mirror circuit to produce an output current proportional to the input current. Thus, since the voltage between the gate and the source of the MOS transistor 12 agrees with the voltage $V_{GS}(t)$ between the gate and the source of the MOS transistor 11, the output current $i_{out}(t)$ takes the value expressed by equation (7) below.

$$i_{out}(t) = \frac{1}{2} \cdot \mu_n \cdot C_{OX} \cdot \frac{W_{12}}{L_{12}} [V_{GS}(t) - V_{thn}]^2 \quad (7)$$

Then, equation (8) will be obtained by substituting equation (7) with equation (6) and rearranging the result;

$$i_{out}(t) = \frac{W_{12}/W_{11}}{L_{12}/L_{11}} \cdot i_{in}(t) \quad (8)$$

where $L_{12}$ and $W_{12}$ respectively represent the gate length and the gate width of the MOS transistor 12.

As the increase of $i_{in}(t)$ ceases in the period between time $t_1$ and time $t_2$, $i_{D11}(t) = i_{in}(t)$ occurs so that the voltage of the terminal 14 falls to bring the PNP transistor 13 into a cut off state until it gets to a value close to $V_{BIAS1}$. Since the terminal 15 has a high impedance, its electric charge does not change at time $t_1$ and the voltage between the gates and the sources of the MOS transistors 11 and 12 is held to $V_{GS}(t_1)$. Under this condition, the output current $i_{out}(t)$ is expressed by equation (9) below in view of equations (6) and (7) above.

$$i_{out}(t) = \frac{W_{12}/W_{11}}{L_{12}/L_{11}} \cdot i_{in}(t_1) \quad (9)$$

Thus, the electric current proportional to the input current $i_{in}(t_1)$ at time $t_1$ is retained.

Then, as $i_{in}(t)$ falls below $i_{in}(t_1)$ in the period between time $t_2$ and time $t_3$ to retain $V_{GS}(t_1)$, the output current $i_{out}(t)$ shows the value expressed by equation (9). Under this condition, the voltage of the terminal 14 falls to a level close to the ground potential at least to maintain $i_{D11}(t) = i_{in}(t)$ and the MOS transistor 11 operates in a non-saturation region.

Then, as the input current keeps on increasing above $i_{in}(t)$ in the period between time $t_3$ and time $t_4$, the voltage of the terminal 14 rises from $V_{BIAS1}$ by about 0.5 to 0.7V, when the PNP transistor 13 moves into a forward active region once again to become turned on so that the electric current that is equal to $i_{in}(t) - i_{D11}(t)$ flows into the terminal 15 by way of the PNP transistor 13 to make the voltage of the terminal 15 rise until the voltage $V_{GS}(t)$ between the gate and the source of the MOS transistor 11 take the value expressed by equation (6) so that an output current $i_{out}(t)$ corresponding to the input current as expressed by equation (8) is obtained.

Thus, it will be understood that, by repeating the above operation in response to fluctuations in the input current, the output current will take a value corresponding to the peak value of the input current.

(Seventh Embodiment)

Figure 9:
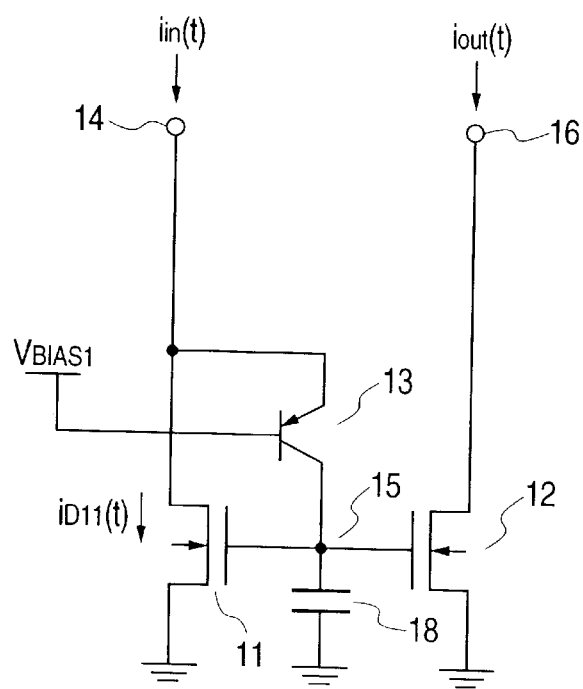

FIG. 9 is a schematic circuit diagram of a seventh embodiment of analog signal processing circuit according to the invention. In FIG. 9, reference numeral 18 denotes a charge holding capacitor for holding the electric charge of the terminal 15. In FIG. 9, the components that are same as or similar to those of the embodiment of FIG. 8 are denoted respectively by the same reference numerals and would not be described here any further. While this embodiment operates in a manner same as the sixth embodiment, it differs from the sixth embodiment in that the voltage of the terminal 15 rises as the electric charge is supplied to the parasitic capacitance between the gates and the sources of the MOS transistors 11 and 12 and also of the capacitance of the charge holding capacitor 18 through the PNP transistor 13. Thus, the quantity of the retained electric charge can be increased to accommodate the increased capacitance for holding the electric charge at the terminal 15. Therefore, if the terminal 15 shows a leak current, the voltage fluctuation error of the terminal 15 can be reduced to a level lower than that of the sixth embodiment after a predetermined period of time to provide an output current corresponding to the peak value of the input current on a more stable basis.

(Eighth Embodiment)

Figure 10:
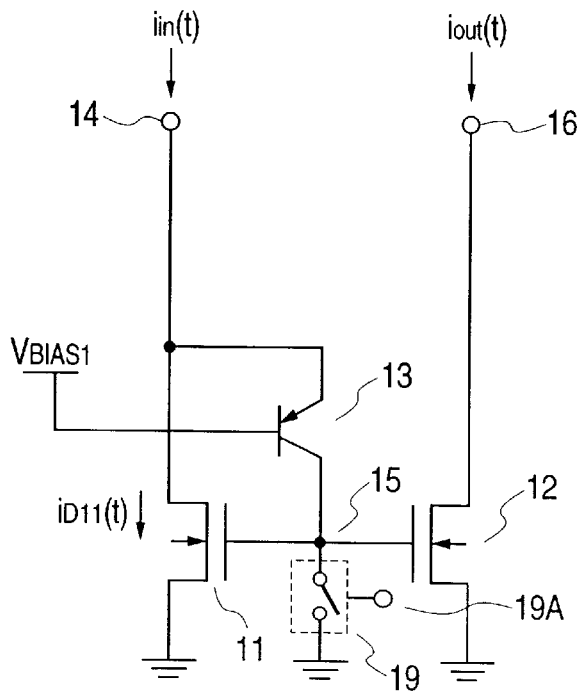

FIG. 10 is a schematic circuit diagram of an eighth embodiment of analog signal processing circuit according to the invention. In FIG. 10, reference numeral 19 denotes a switching element for short-circuiting the ground potential, which is the predetermined reference potential of the terminal 15 and reference symbol 19A denotes a pulse signal input terminal for controlling the operation of closing and opening the switching element. Otherwise, the components that are same as or similar to those of the embodiment of FIG. 8 are denoted respectively by the same reference numerals in FIG. 10 and would not be described here any further. While this embodiment operates same as the sixth embodiment when the switching element 19 is turned off, the terminal 15 and the ground potential are short-circuited when the switching element 19 is in an ON-state so that the potential of the terminal 15 can be reset to the predetermined reference potential. Thus, this embodiment operates same as the sixth embodiment to carry out a new peak hold operation when the switching element 19 is turned on after a peak holding operation and turned off after lowering the voltage of the terminal 15 to the predetermined reference potential.

It may be needless to say that a charge holding capacitor 18 can be added to the terminal 15 of this embodiment to obtain the effect of the seventh embodiment.

(Ninth Embodiment)

Figure 11:
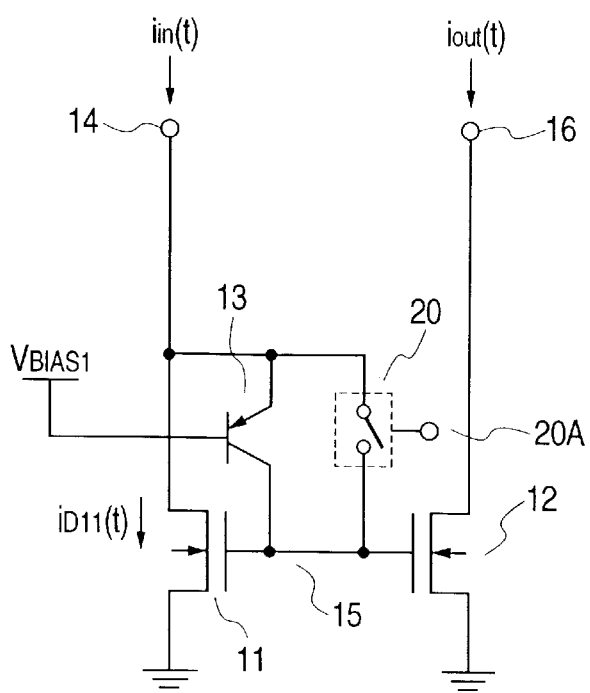

FIG. 11 is a schematic circuit diagram of a ninth embodiment of analog signal processing circuit according to the invention. In FIG. 11, reference numeral 20 denotes a switching element for short-circuiting the terminal 14 and the terminal 15 and reference symbol 20A denotes a pulse signal input terminal for controlling the operation of closing and opening the switching element. Otherwise, the components that are same as or similar to those of the embodiment of FIG. 8 are denoted respectively by the same reference numerals in FIG. 11 and would not be described here any further. While this embodiment operates same as the sixth embodiment when the switching element 20 is turned off, it operates as an ordinary current mirror circuit when the switching element 20 is turned on because the terminal 14 and the terminal 15 are short-circuited. Thus, the peak hold function as described above by referring to the sixth embodiment can be exploited more freely in this embodiment. Additionally, the electric potential of the terminal 15 can be lowered to a reference potential level by turning on the switching element 20 after a peak hold operation if an electric current operating as reference is input so that consequently a reference output current can be obtained as a function of the input to provide the embodiment with a resetting feature. Thus, this embodiment operates same as the sixth embodiment to carry out a new peak hold operation when the switching element 20 is turned off thereafter.

It may be needless to say that a charge holding capacitor 18 can be added to the terminal 15 of this embodiment to obtain the effect of the seventh embodiment.

Still additionally, a switching element 19 for short-circuiting the terminal 15 and the ground potential which is a predetermined reference potential may be added to this embodiment to realize the effect of the eighth embodiment.
(Tenth Embodiment)

Figure 12:
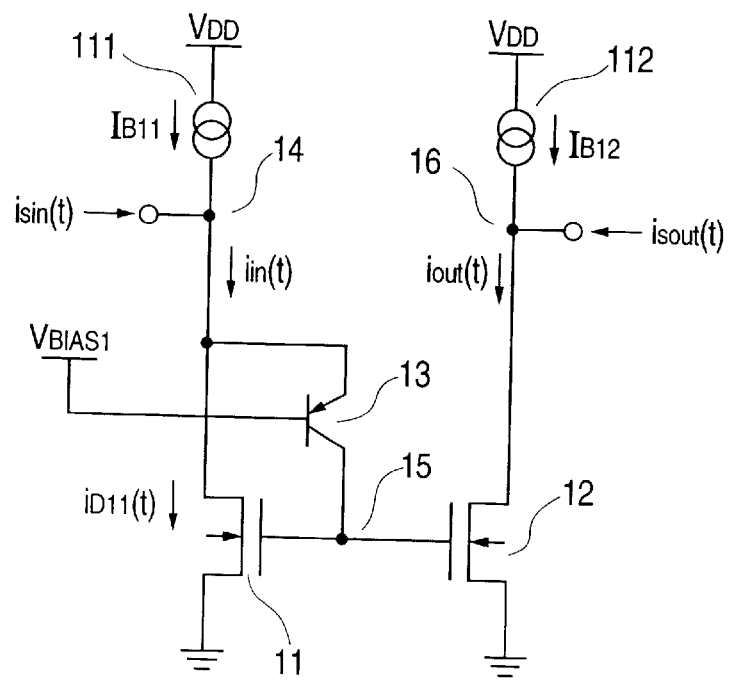

FIG. 12 is a schematic circuit diagram of a tenth embodiment of analog signal processing circuit according to the invention. In FIG. 12, reference numeral 111 denotes a constant current source for supplying the MOS transistor 11 with a predetermined constant bias current $I_{B11}$ in advance, said current source being connected to the terminal 14 and the supply potential ($V_{DD}$). Reference numeral 112 denotes a constant current source connected to the supply potential ($V_{DD}$) with the terminal 16 for supplying the MOS transistor 12 with a constant bias current $I_{B12}$ in advance, which preferably shows a relationship with $I_{B11}$ as expressed by equation (10) to reflect the dimensional ratio of the MOS transistor 11 to the MOS transistor 12.

$$I_{B12} = \frac{W_{12}/W_{11}}{L_{12}/L_{11}} \cdot I_{B11} \tag{10}$$

Otherwise, the components that are same as or similar to those of the embodiment of FIG. 8 are denoted respectively by the same reference numerals in FIG. 12 and would not be described here any further. While this embodiment operates same as the sixth embodiment, it differs from the sixth embodiment in that the electric current $i_{in}(t)$ input to the MOS transistor 11 is expressed as sum of bias current $I_{B11}$ and input signal current $i_{sin}(t)$ and that the electric current $i_{out}(t)$ output from the MOS transistor 12 is expressed as sum of bias current $I_{B12}$ and output signal current $i_{sout}(t)$. This embodiment can handle the signal component independently. While this embodiment is described and illustrated in terms of the constant current sources 111 and 112 added to the sixth embodiment, it will be appreciated that such current sources may be added to any of the seventh through ninth embodiments to realize a substantially same effect.
(Eleventh Embodiment)

Figure 13:
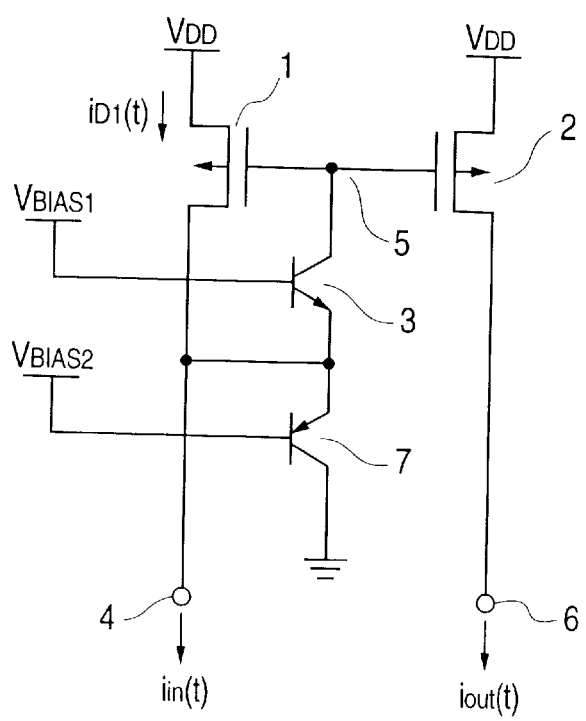

FIG. 13 is a schematic circuit diagram of an eleventh embodiment of analog signal processing circuit according to the invention. This embodiment is realized by modifying the first embodiment for high speed operation. In FIG. 13, reference numeral 7 denotes a PNP transistor having the emitter connected to the terminal commonly connecting the drain of the MOS transistor 1 and the emitter of the NPN transistor 3, the base connected to a reference potential lower than $V_{DD}$ and the collector connected to the ground potential, which is a reference potential lower than $V_{DD}$. Otherwise, the components that are same as or similar to those of the first embodiment of FIG. 2 are denoted respectively by the same reference numerals in FIG. 13 and would not be described here any further. While $V_{BIAS1}$ and $V_{BIAS2}$ may show any value relationship so long as their values are so selected as not to turn on the NPN transistor 3 and the PNP transistor 7 simultaneously, $V_{BIAS1}-V_{BIAS2}$ preferably shows a value as large as possible, while satisfying the above requirement.

Now, the operation of the embodiment of analog signal processing circuit will be described by referring to FIGS. 3A and 3B. Assume here that a value of 0.6V is selected for $V_{BIAS1}-V_{BIAS2}$. Also assume that, initially, the MOS transistor 1 is operating in a saturation region and $i_{D1}(t)$ and $i_{in}(t)$ agree with each other, the potential of the terminal 4 is found between $V_{BIAS1}$ and $V_{BIAS2}$ and the base-emitter voltage of the NPN transistor 3 and the base-emitter voltage of the PNP transistor 7 are commonly about 0.3V so that the both transistors are held in a cut off state. As $i_{in}(t)$ increases from $t_0$ to $t_1$, $i_{D1}(t)<i_{in}(t)$ occurs to make the voltage at terminal 4 fall and, as it falls by about 0.5 to 0.7V from $V_{BIAS1}$, the NPN transistor 3 goes into a forward active region to become turned on so that an electric current equal to $i_{in}(t)-i_{D1}(t)$ flows from the terminal 5 by way of the NPN transistor 3 to make the voltage of the terminal 5 fall until $i_{in}(t)$ agrees with $i_{D1}(t)$ or the voltage $V_{GS}(t)$ between the gate and the source of the MOS transistor 1 gets to the value expressed by equation (1). The voltage of the terminal 5 falls as the electric charge is pulled out of the parasitic capacitance between the gates and the sources of the MOS transistors 1 and 2 connected to it through the NPN transistor 3. At this time, the circuit of FIG. 13 operates as a current mirror circuit to produce an output current proportional to the input current as expressed by equation (3).

As the increase of $i_{in}(t)$ ceases in the period between time $t_1$ and time $t_2$, $i_{D1}(t)=i_{in}(t)$ occurs so that the voltage of the terminal 4 rises to bring both the NPN transistor 3 and the PNP transistor 7 into a cut off state, until it gets to a value between $V_{BIAS1}$ and $V_{BIAS2}$. Since the terminal 5 has a high impedance, its electric charge does not change at time $t_1$ and the voltage between the gates and the sources of the MOS transistors 1 and 2 is held to $V_{GS}(t_1)$. Under this condition, the output current $i_{out}(t)$ is held to a level proportional to the input current $i_{in}(t_1)$ at time $t_1$ as expressed by equation (4).

Then, as $i_{in}(t)$ falls below $i_{in}(t_1)$ in the period between time $t_2$ and time $t_3$, the voltage of the terminal 4 rises. However, since the NPN transistor 3 remains in a cut off state and hence $V_{GS}(t_1)$ is retained, the output current $i_{out}(t)$ shows the value expressed by equation (4). Meanwhile, if the voltage of the terminal 4 rises from $V_{BIAS2}$ by about 0.5 to 0.7V, the PNP transistor 7 moves into a forward active region and becomes turned on to flow an electric current equal to $i_{D1}(t)-i_{in}(t)$ or $i_{in}(t_1)-i_{in}(t)$ and suppress the voltage rise of the terminal 4. Thus, the amplitude of voltage oscillation at the terminal 4 is suppressed to a level lower than that of the first embodiment to allow this embodiment to operate more quickly.

Then, as the input current keeps on increasing above $i_{in}(t)$ in the period between time $t_3$ and time $t_4$, the voltage of the terminal 4 falls from $V_{BIAS1}$ by about 0.5 to 0.7V, when the NPN transistor 3 moves into a forward active region once again to become turned on so that the electric current that is equal to $i_{in}(t)-i_{D1}(t)$ flows out from the terminal 5 by way of the NPN transistor 3 to make the voltage of the terminal 5 fall until the voltage $V_{GS}(t)$ between the gate and the source of the MOS transistor 1 take the value expressed by equation (1) so that an output current $i_{out}(t)$ corresponding to the input current as expressed by equation (3) is obtained.

Thus, it will be understood from the above description that, by repeating the above operation in response to fluctuations in the input current, the output current will take a value corresponding to the peak value of the input current.

It would be understood that a higher speed operation rather than the first embodiment can be provided.

Additionally, in this embodiment, a charge holding capacitor 8 may be added to the terminal 5 and a switching element 9 for resetting operations may be added between the terminal 5 and a predetermined reference potential, while constant current sources 101 and 102 may be added respectively to the terminals 4 and 6 to realize the effect of the second, third and fifth embodiments.

(Twelfth Embodiment)

Figure 14:
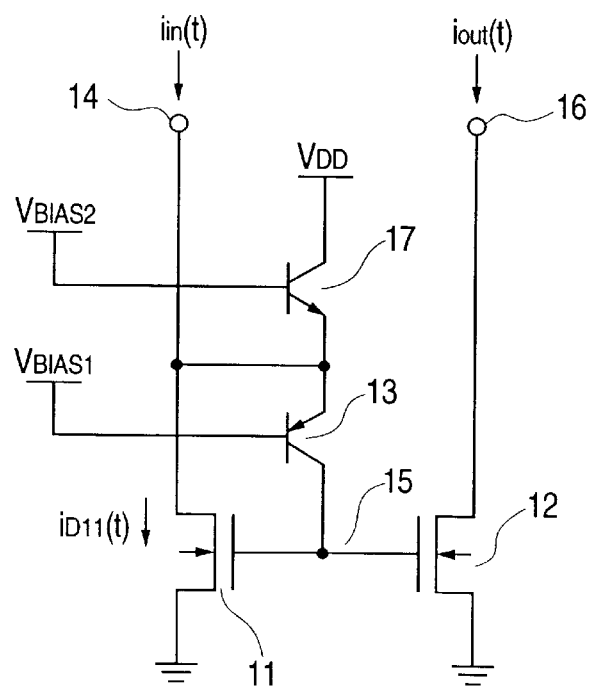

FIG. 14 is a schematic circuit diagram of a twelfth embodiment of analog signal processing circuit according to the invention. This embodiment shows conductivity types opposite to those of the eleventh embodiment and is realized by modifying the sixth embodiment for high speed operation. In FIG. 14, reference numeral 17 denotes an NPN transistor having the emitter connected to the terminal commonly connecting the drain of the MOS transistor 11 and the emitter of the PNP transistor 13, the base connected to a reference potential ($V_{BIAS2}$) higher than the ground potential and the collector connected to another reference potential $V_{DD}$ higher than the ground potential. Otherwise, the components that are same as or similar to those of the sixth embodiment of FIG. 8 are denoted respectively by the same reference numerals in FIG. 14 and would not be described here any further. While $V_{BIAS1}$ and $V_{BIAS2}$ may show any value relationship so long as their values are so selected as not to turn on the PNP transistor 13 and the NPN transistor 17 simultaneously, $V_{BIAS2}-V_{BIAS1}$ preferably shows a value as large as possible, while satisfying the above requirement.

Now, the operation of the embodiment of analog signal processing circuit will be described by referring to FIGS. 3A and 3B. Assume here that a value of 0.6V is selected for $V_{BIAS2}-V_{BIAS1}$ Also assume that, initially, the MOS transistor 11 is operating in a saturation region and $i_{D11}(t)$ and $i_{in}(t)$ agree with each other, the potential of the terminal 14 is found between $V_{BIAS1}$ and $V_{BIAS2}$ and the base-emitter voltage of the PNP transistor 13 and the base-emitter voltage of the NPN transistor 17 are commonly about 0.3V so that the both transistors are held in a cut off state. As $i_{in}(t)$ increases from $t_0$ to $t_1$, $i_{D11}(t)<i_{in}(t)$ occurs to make the voltage at terminal 14 rise and, as it rises by about 0.5 to 0.7V from $V_{BIAS1}$, the PNP transistor 13 goes into a forward active region to become turned on so that an electric current equal to $i_{in}(t)-i_{D11}(t)$ flows from the terminal 15 by way of the PNP transistor 13 to make the voltage of the terminal 15 rise until $i_{in}(t)$ agrees with $i_{D11}(t)$ or the voltage $V_{GS}(t)$ between the gate and the source of the MOS transistor 11 gets to the value expressed by equation (6). The voltage of the terminal 15 rises as the electric charge is supplied to the parasitic capacitance between the gates and the sources of the MOS transistors 11 and 12 connected to it through the PNP transistor 13. At this time, the circuit of FIG. 14 operates as a current mirror circuit to produce an output current proportional to the input current as expressed by equation (8).

As the increase of $i_{in}(t)$ ceases in the period between time $t_1$ and time $t_2$, $i_{D11}(t)=i_{in}(t)$ occurs so that the voltage of the terminal 14 falls to bring both the PNP transistor 13 and the NPN transistor 17 into a cut off state, until it gets to a value between $V_{BIAS1}$ and $V_{BIAS2}$. Since the terminal 15 has a high impedance, its electric charge does not change at time $t_1$ and the voltage between the gates and the sources of the MOS transistors 11 and 12 is held to $V_{GS}(t_1)$. Under this condition, the output current $i_{out}(t)$ is held to a level proportional to the input current $i_{in}(t_1)$ at time $t_1$ as expressed by equation (9).

Then, as $i_{in}(t)$ falls below $i_{in}(t_1)$ in the period between time $t_2$ and time $t_3$, the voltage of the terminals 13, 14 falls further. However, since the PNP transistor 13 remains in a cut off state and hence $V_{GS}(t_1)$ is retained, the output current $i_{out}(t)$ shows the value expressed by equation (9). Meanwhile, if the voltage of the terminal 14 falls from $V_{BIAS2}$ by about 0.5 to 0.7V, the NPN transistor 17 moves into a forward active region and becomes turned on to flow an electric current equal to $i_{D11}(t)-i_{in}(t)$ or $i_{in}(t_1)-i_{in}(t)$ and suppress the voltage fall of the terminal 14. Thus, the amplitude of voltage oscillation at the terminal 14 is suppressed to a level lower than that of the sixth embodiment to allow this embodiment to operate more quickly.

Then, as the input current keeps on increasing above $i_{in}(t)$ in the period between time $t_3$ and time $t_4$, the voltage of the terminal 14 rises from $V_{BIAS1}$ by about 0.5 to 0.7V, when the PNP transistor 13 moves into a forward active region once again to become turned on so that the electric current that is equal to $i_{in}(t)-i_{D11}(t)$ flows into the terminal 15 by way of the PNP transistor 13 sp that $i_{in}(t)$ equals $i_{D11}(t_1)$, to make the voltage of the terminal 15 rise until the voltage $V_{GS}(t)$ between the gate and the source of the MOS transistor 11 take the value expressed by equation (6), so that an output current $i_{out}(t)$ corresponding to the input current as expressed by equation (8) is obtained.

Thus, it will be understood from the above description that, by repeating the above operation in response to fluctuations in the input current, the output current will take a value corresponding to the peak value of the input current.

It would be understood that a higher speed operation rather than the sixth embodiment can be provided.

Additionally, in this embodiment, a charge holding capacitor 18 may be added to the terminal 15 and a switching element 19 for resetting operations may be added between the terminal 15 and a predetermined reference potential, while constant current sources 111 and 112 may be added respectively to the terminals 14 and 16 to realize the effect of the seventh, eighth and tenth embodiments.

(Thirteenth Embodiment)

Figure 15:
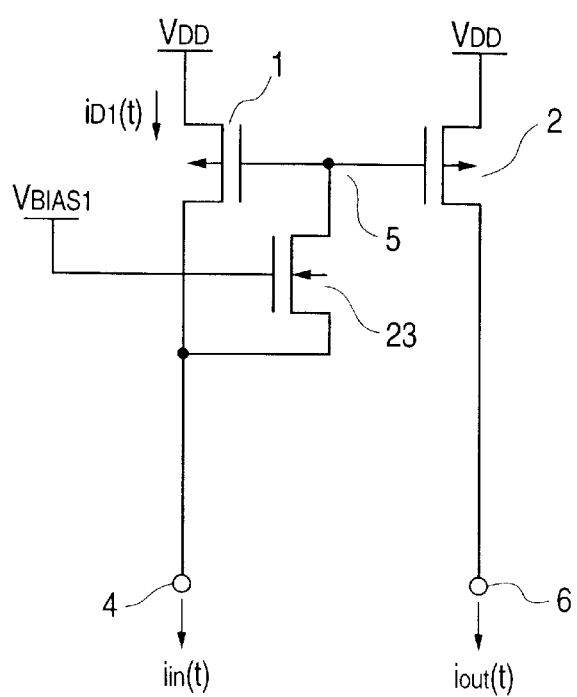

FIG. 15 is a schematic circuit diagram of a thirteenth embodiment of analog signal processing circuit according to the invention. This embodiment is realized by replacing the NPN transistor of the first embodiment by an N-type MOS transistor. In FIG. 15, reference numeral 23 denotes an N-type MOS transistor having the drain connected to the terminal 5, the source connected to the terminal 4 and the gate connected to a reference potential ($V_{BIAS1}$) lower than $V_{DD}$. In FIG. 15, the components that are same as or similar to those of the embodiment of FIG. 2 are denoted respectively by the same reference numerals and would not be described here any further. While this embodiment operates in a manner same as the first embodiment, it differs from the first embodiment in that the MOS transistor 23 is turned on to lower the voltage of the terminal 5 when the voltage of the terminal 4 falls from $V_{BIAS1}$ and undergoes the threshold voltage of the MOS transistor 23. Thus, this embodiment provides an output current corresponding to the peak value of the input current as in the case of the first embodiment.

Additionally, in this embodiment, a charge holding capacitor 8 may be added to the terminal 5 and a switching element 9 for resetting operations may be added between the terminal 5 and a predetermined reference potential, while a switching element 10 may be added between the terminals 4 and 5 and constant current sources 101 and 102 may be added respectively to the terminals 4 and 6 to realize the effect of the second, third, fourth and fifth embodiments.

(Fourteenth Embodiment)

Figure 16:
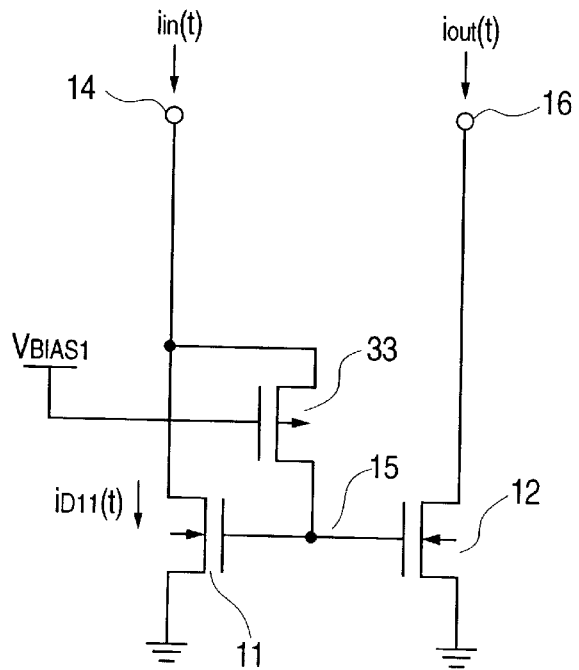

FIG. 16 is a schematic circuit diagram of a fourteenth embodiment of analog signal processing circuit according to the invention. This embodiment shows conductivity types opposite to those of the thirteenth embodiment and is realized by replacing the PNP transistor of the sixth embodiment by a P-type MOS transistor. In FIG. 16, reference numeral 33 denotes a P-type MOS transistor having the drain connected to the terminal 15, the source connected to the terminal 14 and the gate connected to a reference potential ($V_{BIAS1}$) higher than the ground potential. In FIG. 16, the components that are same as or similar to those of the embodiment of FIG. 8 are denoted respectively by the same reference numerals and would not be described here any further. While this embodiment operates in a manner same as the sixth embodiment, it differs from the sixth embodiment in that the MOS transistor 33 is turned on to lower the voltage of the terminal 15 when the voltage of the terminal 14 rises from $V_{BIAS1}$ and goes over the threshold voltage of the MOS transistor 33. Thus, this embodiment provides an output current corresponding to the peak value of the input current as in the case of the sixth embodiment.

Additionally, in this embodiment, a charge holding capacitor 18 may be added to the terminal 15 and a switching element 19 for resetting operations may be added between the terminal 15 and a predetermined reference potential, while a switching element 20 may be added between the terminals 14 and 15 and constant current sources 111 and 112 may be added respectively to the terminals 14 and 16 to realize the effect of the seventh, eighth, ninth and tenth embodiments.

(Fifteenth Embodiment)

Figure 17:
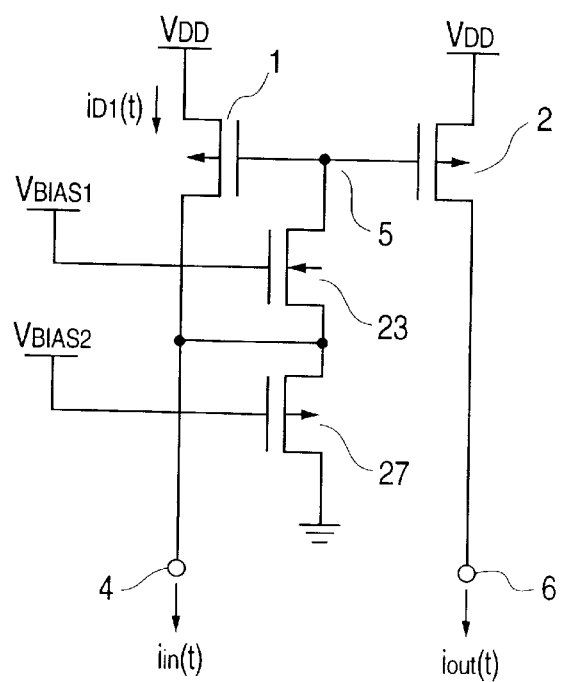

FIG. 17 is a schematic circuit diagram of a fifteenth embodiment of analog signal processing circuit according to the invention. This embodiment is realized by modifying the thirteenth embodiment for high speed operation. It will be appreciated that the NPN transistor and the PNP transistor of the eleventh embodiment are respectively replaced by an N-type MOS transistor and a P-type MOS transistor in this embodiment. In FIG. 17, reference numeral 27 denotes a P-type MOS transistor having the source connected to the terminal commonly connecting the drain of the MOS transistor 1 and source of the MOS transistor 23, the gate connected to a reference potential ($V_{BIAS2}$) lower than $V_{DD}$ and the drain connected to the ground potential that is another reference potential lower than $V_{DD}$. In FIG. 17, the components that are same as or similar to those of the embodiment of FIG. 15 are denoted respectively by the same reference numerals and would not be described here any further. While $V_{BIAS1}$ and $V_{BIAS2}$ may show any value relationship so long as their values are so selected as not to turn on the two MOS transistors 23 and 27 simultaneously, $V_{BIAS1}-V_{BIAS2}$ preferably shows a value as large as possible, while satisfying the above requirement. While this embodiment operates in a manner same as the eleventh and thirteenth embodiments, it differs from those embodiments in that the MOS transistor 23 is turned on to lower the voltage of the terminal 5 when the voltage of the terminal 4 falls from $V_{BIAS1}$ and undergoes the threshold voltage of the MOS transistor 23 and the MOS transistor 27 is turned on when the voltage of the terminal 4 rises from $V_{BIAS2}$ and goes above the threshold voltage of the MOS transistor 27 to turn on the MOS transistor 27 and causes an electric current equal to $i_{D1}(t)-i_{in}(t)$, or $i_{in}(t_1)-i_{in}(t)$ to flow and suppress the voltage rise of the terminal 4. The amplitude of voltage oscillation of the terminal 4 can be made smaller than that of the thirteenth embodiment to allow this embodiment to operate more quickly than the thirteenth embodiments and produce an output current corresponding to the peak value of the input current.

Additionally, in this embodiment, a charge holding capacitor 8 may be added to the terminal 5 and a switching element 9 for resetting operations may be added between the terminal 5 and a predetermined reference potential, while constant current sources 101 and 102 may be added respectively to the terminals 4 and 6 to realize the effect of the second, third and fifth embodiments.

(Sixteenth Embodiment)

Figure 18:
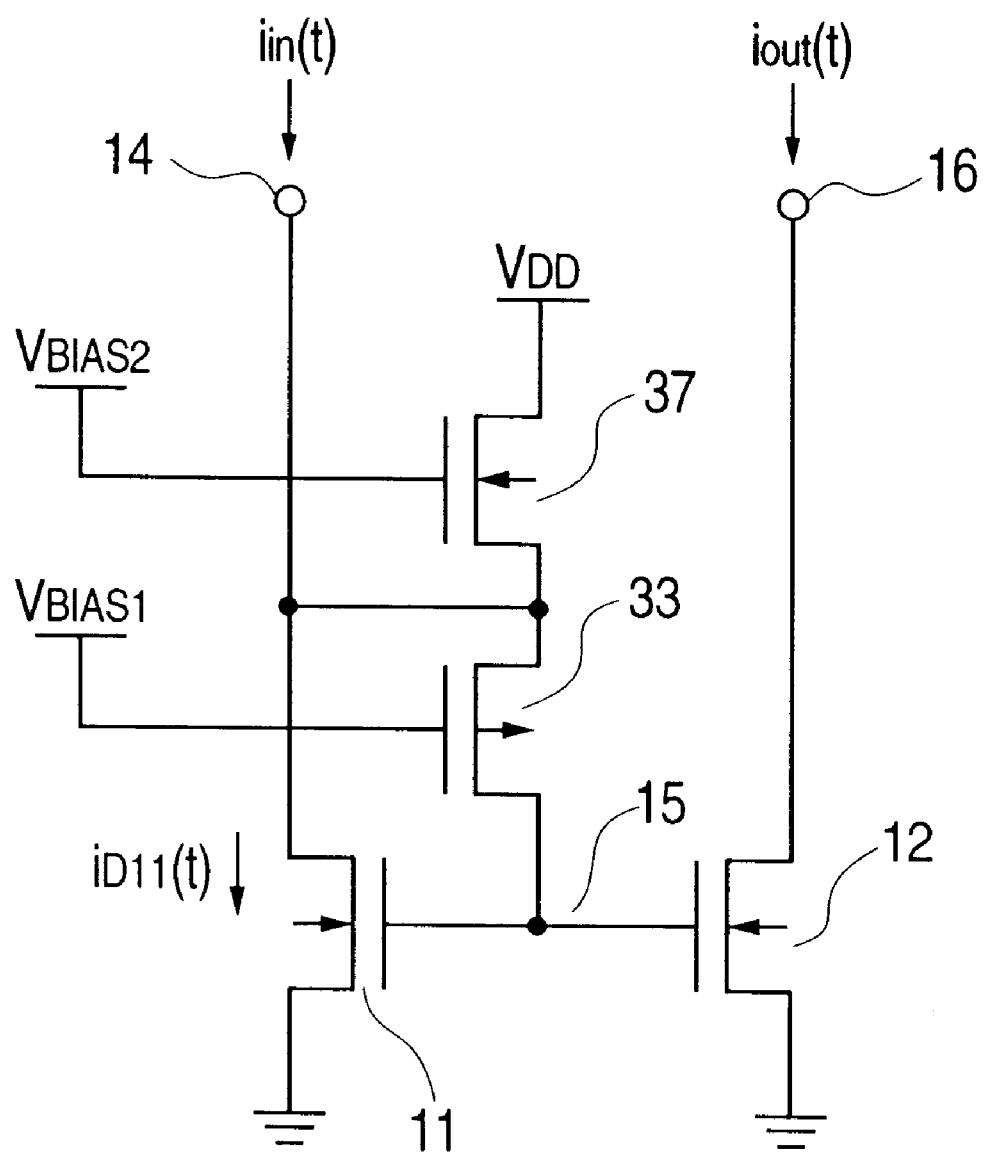

FIG. 18 is a schematic circuit diagram of a sixteenth embodiment of analog signal processing circuit according to the invention. This embodiment is realized by modifying the fourteenth embodiment for high speed operation. It will be appreciated that the PNP transistor and the NPN transistor of the twelfth embodiment are respectively replaced by a P-type MOS transistor and an N-type MOS transistor in this embodiment. In FIG. 18, reference numeral 37 denotes an N-type MOS transistor having the source connected to the terminal commonly connecting the drain of the MOS transistor 11 and the source of the MOS transistor 33, the gate connected to a reference potential ($V_{BIAS2}$) higher than the ground potential and the drain connected to $V_{DD}$ that is another reference potential higher than the ground potential. In FIG. 18, the components that are same as or similar to those of the embodiment of FIG. 16 are denoted respectively by the same reference numerals and would not be described here any further. While $V_{BIAS1}$ and $V_{BIAS2}$ may show any value relationship so long as their values are so selected as not to turn on the two MOS transistors 33 and 37 simultaneously, $V_{BIAS2}-V_{BIAS1}$ preferably shows a value as large as possible, while satisfying the above requirement. While this embodiment operates in a manner same as the twelfth and fourteenth embodiments, it differs from those embodiments in that the MOS transistor 33 is turned on to raise the voltage of the terminal 15 when the voltage of the terminal 14 rises from $V_{BIAS1}$ and goes over the threshold voltage of the MOS transistor 33 and the MOS transistor 37 is turned on when the voltage of the terminal 14 falls from $V_{BIAS2}$ and goes under the threshold voltage of the MOS transistor 37 to turn on the MOS transistor 37 and causes an electric current equal to $i_{D11}(t)-i_{in}(t)$, or $i_{in}(t_1)-i_{in}(t)$, to flow and suppress the voltage fall of the terminal 14. Thus, the amplitude of voltage oscillation of the terminal 14 can be made smaller than that of the fourteenth embodiment to allow this embodiment to operate more quickly than the fourteenth embodiments and produce an output current corresponding to the peak value of the input current.

Additionally, in this embodiment, a charge holding capacitor 18 may be added to the terminal 15 and a switching element 19 for resetting operations may be added between the terminal 15 and a predetermined reference potential, while constant current sources 111 and 112 may be added respectively to the terminals 14 and 16 to realize the effect of the seventh, eighth and tenth embodiments.

(Seventeenth Embodiment)

This embodiment is an image forming apparatus utilizing a peak detection circuit according to the invention.

Figure 19:
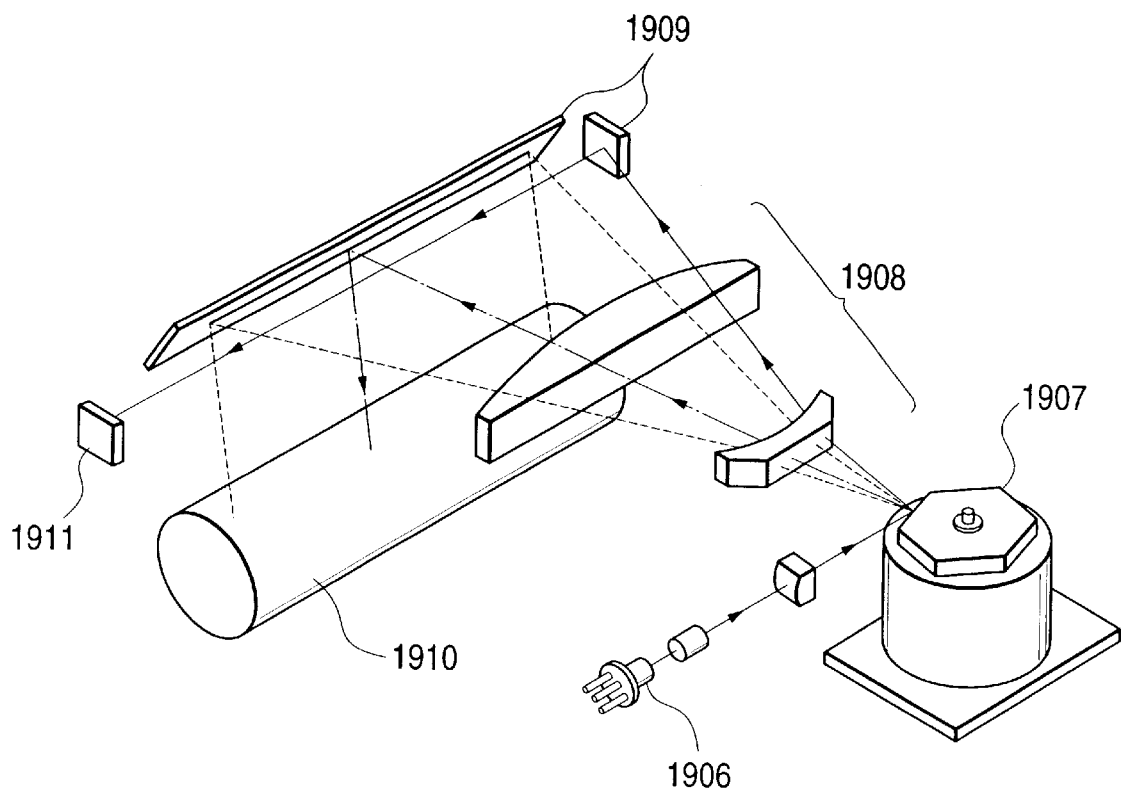
FIG. 19 is a schematic perspective view of an embodiment of image forming apparatus according to the invention, showing only a principal portion thereof.

FIG. 19 schematically illustrates an apparatus such as a laser beam printer designed to form an image on a photosensitive drum by means of a laser beam. It comprises a laser diode 1906, a polygon mirror 1907 for carrying out a scanning operation by means of the laser beam, a lens system 1908, reflectors 1909 and a photosensitive drum 1910. Photo detector 1911 generates a binary horizontal synchronizing signal when it detects a laser beam that passes through a predetermined spot.

Figure 20:
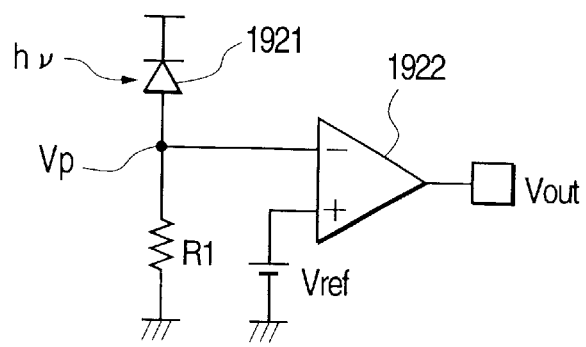
FIG. 20 is a schematic circuit diagram of a circuit for obtaining a synchronizing signal.

As shown in FIG. 20, the photo detector comprises a photodiode 1921, a resistor R1 for transforming the photovoltaic current of the photodiode 1921 into a voltage and a voltage comparator 1922 that receives the photoelectric conversion output Vp at one of its inputs and reference voltage Vref for determining the threshold level for the purpose of binarization at the other input.

However, with the circuit configuration of FIG. 20, the photoelectric conversion output Vp changes its oscillation amplitude while the reference voltage Vref remain constant when the quantity of light input to the photo detector changes because the photoelectric conversion output Vp and the reference voltage Vref constituting the two inputs of the voltage comparators 19, 22 operate independently from each other. Then, the threshold level can relatively fluctuate, leading to a varied timing for generating horizontal synchronizing signal Vout and a changeable inclination with which the rising or falling waveform of the photoelectric conversion output Vp intersects the threshold level so that, as a result, a remarkably degraded jitter can occur. In other words, fluctuations in the laser power with time and/or due to temperature changes and/or those in the quantity of light caused by reduced transmittivity and reflectivity attributable to the smeared polygon mirror 1907, lens system 1908 and/or reflector 1909 provide obstacles for producing a stable video output. Additionally, image forming apparatus of different types using different laser powers are normally not compatible with each other and, therefore, the laser power has to be regulated by means of a resistor R1 or by using a variable voltage source for the reference voltage Vref in order to make different image forming appratus compatible with each other.

To the contrary, this embodiment of the invention can generate a high precision horizontal synchronizing signal on a stable basis if the quantity of incident light fluctuates.

Figure 21:
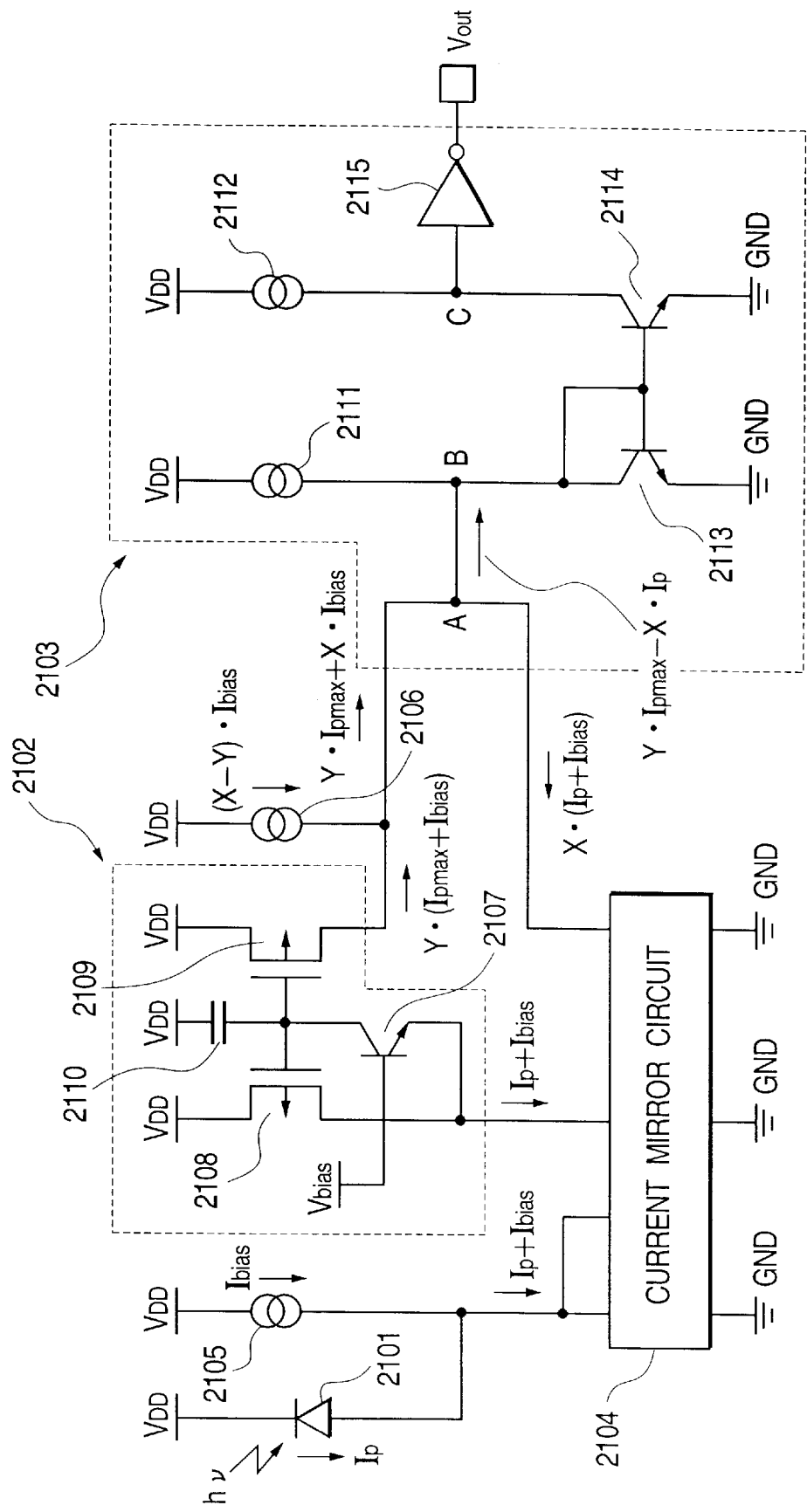
FIG. 21 is a circuit diagram of a circuit comprising an analog signal processing circuit according to the invention for obtaining a synchronizing signal.

FIG. 21 is a schematic circuit diagram of an embodiment of photo detector that can suitably be used as photo detector 1911 for the image forming apparatus illustrated in FIG. 19. Referring to FIG. 21, it comprises a photodiode 2101 operating as photoelectric converter, a peak hold circuit 2102 for holding an electric current value proportional to the peak electric current value of the output of the photodiode 2101, a comparator 2103 for receiving and comparing the electric current value proportional to the electric current value output from the photodiode 2101 and the electric current value retained by the peak hold circuit 2102 operating in a current mode, a current mirror circuit 2104 for transferring the electric current proportional to the output current of the photodiode 2101 to the peak hold circuit 2102 operating in a current mode and also to the comparator 2103 for receiving current inputs, a constant current source 2105 for supplying bias current Ibias in order to keep in advance the current mirror circuit 2104 in an active state and a constant current source 2106 for supplying electric current $(X-Y) \cdot Ibias$ in order to cancel the bias current component.

The peak hold circuit 2102 operating in a current mode by turn comprises an NPN transistor 2107 having its base connected to constant voltage Vbias, PMOS transistors 2108, 2109 showing a dimensional ratio of 1:Y and a hold capacitance 2110, whereas the comparator for receiving current inputs comprises constant current sources 2111, 2112, NPN transistors 2113, 2114 and an inverter 2115.

The photodoiode 2101 outputs electric current Ip as a function of the quantity of incident light, which current is then led to the peak hold circuit 2102 operating in a current mode by way of the current mirror circuit 2104. If the maximum value of the electric current Ip is Ipmax, the drain current of the PMOS transistor 2109 is held to a current value of $Y \cdot (Ipmax+Ibias)$. Then, as current $(X-Y) \cdot Ibias$ for canceling the bias current component fed from the constant current source 2106 is added to the retained current $Y \cdot (Ipmax+Ibias)$, a current $Y \cdot Ipmax+X \cdot Ibias$ is made to flow to one of the input terminals of the comparator 2103. On the other hand, an electric current equal to $X \cdot (Ip+Ibias)$ is pulled out of the other input terminal of the comparator 2103 by way of the current mirror circuit 2104. The two current inputs meet at node A to cancel the bias current component. Then, a current $Y \cdot Ipmax-X \cdot Ip$ or $X \cdot ((Y/X) \cdot Ipmax-Ip)$ flows from node A to node B as indicated by phantom arrow in FIG. 21. The electric potential of node C falls toward the ground potential GND to bring the output Vout of the inverter 15 to level HIGH as the current flows from node A to node B, whereas the electric potential of node C rises toward the supply potential $V_{DD}$ to bring the output Vout of the inverter 15 to level LOW as the current flows reversely from node B to node A. Thus the photo detector of this embodiment outputs level HIGH when $X \cdot ((Y/X) \cdot Ipmax-Ip)>0$ or Ip is smaller than Y/X times of Ipmax and outputs level HIGH when $X \cdot ((Y/X) \cdot Ipmax-Ip)<0$ or Ip is greater than Y/X times of Ipmax. As will be understood from the above description, the photo detector of this embodiment can automatically determine a threshold level as a function of the peak value of the input light by selecting desired values for X and Y so that a high precision horizontal synchronizing signal can be obtained stably regardless of fluctuations in the quantity of incident light.

With this embodiment, it is possible to provide a photo detector to be used for an image forming apparatus adapted to form an image on a photosensitive drum by means of a laser beam on a stable basis, said detector comprising a photoelectric conversion means, a means for holding the peak output value of the photoelectric conversion means, a means for generating a reference level as a function of the held peak value and a means for comparing the output of said photoelectric conversion means and the generated reference level in order to electrically generate a horizontal synchronizing signal. Since a photo detector according to the invention can be adapted to a wide variety of image forming apparatus because it stores the maximum value of quantity of incident light with which the photo detector is irradiated in order to automatically determine a threshold level and hence it does not require any regulating operations to make it adapted to a particular image forming apparatus.

It may be appreciated that the circuit configuration of the peak hold means 2102 operating in a current mode and that of the comparator 2103 for comparing input currents may respectively show different circuit configurations in this embodiment. Additionally, while the current mirror 2104 is used to transfer the output current of the photodiode 2101 to the peak hold means 2102 operating in the current mode and to the comparator 2103 for receiving electric currents as inputs in this embodiment, other current transferring means may alternatively be used. It may be needless to say that the elements of this embodiment may be replaced by those showing the opposite conductivity type.

As described in detail, an analog signal processing circuit according to the invention makes it possible to provide a peak hold circuit having a relatively small circuit configuration and adapted to operate in a current mode in order to produce an output current as a function of the peak value of the input current.

Additionally, according to the invention, there is provided a photo detector adapted to generate a high precision horizontal synchronizing signal stably regardless of fluctuations in the quantity of incident light. A photo detector according to the invention can be adapted to a wide variety of image forming apparatus because it does not require any complicated regulating operations to make it adapted to a particular image forming apparatus.

Still additionally, an image forming apparatus adapted to detect a scanning laser beam for generating a horizontal synchronizing signal can stably produce output video signals regardless of fluctuations in the laser power, smears of the optical system and/or fluctuations in the quantity of incident light of the optical system.

What is claimed is:

1. An analog signal processing circuit comprising:
   first and second field effect transistors having gates commonly connected, and having sources connected, to a predetermined first reference potential; and
   a transistor having a first main electrode connected with the gates of said first and second field effect transistors, a second main electrode connected with a drain of said first field effect transistor and a control electrode connected with a second reference potential,
   wherein, according to an input current inputted in said second main electrode of said transistor, said transistor is turned on or off.

2. An analog signal processing circuit according to claim 1, wherein a storage means for holding an electric charge is connected to the commonly connected gates of said first and second field effect transistors.

3. An analog signal processing circuit according to claim 1, wherein a switching means is added between the commonly connected gates of said first and second field effect transistors and a predetermined reference potential.

4. An analog signal processing circuit according to claim 1, wherein a switching means is added between the commonly connected gates of said first and second field effect transistors and the connecting section of the drain of said first field effect transistor and the second main electrode of said transistor.

5. An analog signal processing circuit according to claim 1, wherein said first and second field effect transistors are of the P-type and said transistor is of the NPN-type, said second reference potential being so selected as to be lower than said first reference potential.

6. An analog signal processing circuit according to claim 1, wherein said first and second field effect transistors are of the N-type and said transistor is of the PNP-type, said second reference potential being so selected as to be lower than said first reference potential.

7. An analog signal processing circuit according to claim 1, wherein said first and second field effect transistors are of the P-type and said transistor is an N-type field effect transistor, said second reference potential being so selected as to be lower than said first reference potential.

8. An analog signal processing circuit according to claim 1, wherein said first and second field effect transistors are of the N-type and said transistor is a P-type field effect transistor, said second reference potential being so selected as to be lower than said first reference potential.

9. An analog signal processing circuit comprising:
   first and second field effect transistors having gates commonly connected, and having sources connected, to a predetermined first reference potential;
   a first transistor having a first main electrode connected with the gates of said first and second field effect transistors, a second main electrode connected with a drain of said first field effect transistor and a control electrode connected to a second reference potential; and
   a second transistor of a conductivity type different from that of said first transistor, said second transistor having a second main electrode connected with the second main electrode of said first transistor, a control electrode connected to a third reference potential and a first main electrode connected to a fourth reference potential;
   the difference between said second and third reference potentials being so selected as not to turning on both of said first and second transistors simultaneously.

10. An analog signal processing circuit according to claim 9, wherein a storage means for holding an electric charge is connected to the commonly connected gates of said first and second field effect transistors.

11. An analog signal processing circuit according to claim 9, wherein a switching means is added between the commonly connected gates of said first and second field effect transistors and a predetermined reference potential.

12. An analog signal processing circuit according to claim 9, wherein said first and second field effect transistors are of the P-type and said first transistor is of the NPN-type whereas said second transistor is of the PNP-type, said second, third and fourth reference potentials being so selected as to be lower than said first reference potential.

13. An analog signal processing circuit according to claim 9, wherein said first and second field effect transistors are of the N-type and said first transistor is of the PNP-type whereas said second transistor is of the NPN-type, said second, third and fourth reference potentials being so selected as to be higher than said first reference potential.

14. An analog signal processing circuit according to claim 9, wherein said first and second field effect transistors are of the P-type and said first transistor is an N-type field effect transistor whereas said second transistor is a P-type field effect transistor, said second, third and fourth reference potentials being so selected as to be lower than said first reference potential.

15. An analog signal processing circuit according to claim 9, wherein said first and second field effect transistors are of the N-type and said first transistor is a P-type field effect transistor whereas said second transistor is an N-type field effect transistor, said second, third and fourth reference potentials being so selected as to be higher than said first reference potential.

16. An analog signal processing circuit comprising:
   first and second field effect transistors having gates commonly connected, and sources connected, to a predetermined first reference potential; and
   a transistor having a first main electrode connected with the gates of said first and second field effect transistors, a second main electrode connected with a drain of said first field effect transistor, and a control electrode connected with a second reference potential, wherein an output current according to a peak value of an input current inputted in said second main electrode of said transistor is outputted from a drain of said second field effect transistor.

17. An analog signal processing circuit according to claim 16, further comprising a storage means for holding an electric charge, connected to the commonly connected gates of said first and second field effect transistors.

18. An analog signal processing circuit according to claim 16, further comprising a switching means between the commonly connected gates of said first and second field effect transistors and a predetermined reference potential.

19. An analog signal processing circuit according to claim 16, further comprising a switching means between the commonly connected gates of said first and second field effect transistors and the connecting section of the drain of said first field effect transistor and the second main electrode of said transistor.

20. An analog signal processing circuit according to claim 16, wherein said first and second field effect transistors are of P-type and said transistor is of NPN-type, said second reference potential being so selected as to be lower than said first reference potential.

21. An analog signal processing circuit according to claim 16, wherein said first and second field effect transistors are of N-type and said transistor is of PNP-type, said second reference potential being so selected as to be lower than said first reference potential.

22. An analog signal processing circuit according to claim 16, wherein said first and second field effect transistors are of P-type and said transistor is an N-type field effect transistor, said second reference potential being so selected as to be lower, than said first reference potential.

23. An analog signal processing circuit according to claim 16, wherein said first and second field effect transistors are of N-type and said transistor is a P-type field effect transistor, said second reference potential being so selected as to be lower than said first reference potential.

24. An analog signal processing circuit comprising:
first and second field effect transistors having gates commonly connected, and sources connected, to a predetermined first reference potential;
a first transistor having a first main electrode connected with the gates of said first and second field effect transistors, a second main electrode connected with a drain of said first field effect transistor and a control electrode connected to a second reference potential; and
a second transistor of a conductivity type different from that of said first transistor, said second transistor having a second main electrode connected with the second main electrode of said first transistor, a control electrode connected to a third reference potential and a first main electrode connected to a fourth reference potential;
wherein said first transistor is turned on or off according to an input current inputted in said second main electrode of said first transistor, and said second transistor suppresses an increase and a decrease of a voltage at said second main electrode of said first transistor.

* * * * *

UNITED STATES PATENT AND TRADEMARK OFFICE
CERTIFICATE OF CORRECTION

PATENT NO. : 6,410,903 B1
DATED : June 25, 2002
INVENTOR(S) : Keizo Miyazaki

It is certified that error appears in the above-identified patent and that said Letters Patent is hereby corrected as shown below:

Title page, Item [54] and Column 1, line 1
"CIRCUIT" should read -- CIRCUIT, --.
Item [56], FOREIGN PATENT DOCUMENTS,
"EP 0507298
EP0535808
EP 0788046" should read
-- EP 0 507 298
EP 0 535 808
EP 0 788 046 --.

Column 2,
Line 8, "turning" should read -- turn --.

Column 4,
Line 17, "As" should read -- ¶As --; and
Line 49, "corresponding" should read -- corresponds --.

Column 7,
Line 9, "rises" should read -- rise --; and
Line 48, "$V_{BIAS1}.$" should read -- $V_{BIAS1}.$ --.

Column 8,
Line 9, "take" should read -- takes --.

Column 10,
Line 21, "$V_{BIAS1}-V_{BIAS2}$" should read -- $V_{BIAS1}-V_{BIAS2}.$ --; and
Line 26, "the both" should read -- both --.

Column 11,
Line 7, "take" should read -- takes --;
Line 48, "$V_{BIAS2}-V_{BIAS1}$" should read -- $V_{BIAS2}-V_{BIAS1}.$ --; and
Line 54, "the both" should read -- both --.

Column 12,
Line 33, "sp" should read -- so --.

Column 15,
Line 22, "remain" should read -- remains --.

UNITED STATES PATENT AND TRADEMARK OFFICE
CERTIFICATE OF CORRECTION

PATENT NO. : 6,410,903 B1
DATED : June 25, 2002
INVENTOR(S) : Keizo Miyazaki

It is certified that error appears in the above-identified patent and that said Letters Patent is hereby corrected as shown below:

<u>Column 16,</u>
Line 57, "level and" should read -- level, --.

Signed and Sealed this

First Day of April, 2003

JAMES E. ROGAN
*Director of the United States Patent and Trademark Office*